(12) United States Patent
Xiao et al.

(10) Patent No.: US 9,858,874 B2
(45) Date of Patent: Jan. 2, 2018

(54) SCAN DRIVING CIRCUIT

(71) Applicant: WUHAN CHINA STAR OPTOELECTRONICS TECHNOLOGY CO., LTD., Wuhan, Hubei (CN)

(72) Inventors: Juncheng Xiao, Hubei (CN); Mang Zhao, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 332 days.

(21) Appl. No.: 14/783,863

(22) PCT Filed: Aug. 27, 2015

(86) PCT No.: PCT/CN2015/088262
§ 371 (c)(1),
(2) Date: Oct. 11, 2015

(87) PCT Pub. No.: WO2017/031755
PCT Pub. Date: Mar. 2, 2017

(65) Prior Publication Data
US 2017/0323605 A1    Nov. 9, 2017

(30) Foreign Application Priority Data

Aug. 24, 2015  (CN) .......................... 2015 1 0523107

(51) Int. Cl.
*G09G 3/36* (2006.01)
*G09G 3/30* (2006.01)

(52) U.S. Cl.
CPC ............. *G09G 3/3614* (2013.01); *G09G 3/30* (2013.01); *G09G 3/36* (2013.01); *G09G 3/3677* (2013.01); *G09G 2310/0232* (2013.01); *G09G 2330/021* (2013.01)

(58) Field of Classification Search
CPC ............... G09G 3/3677; G09G 3/3696; G09G 2310/061
See application file for complete search history.

(56) References Cited

U.S. PATENT DOCUMENTS

| | | | | |
|---|---|---|---|---|
| 2003/0231735 A1* | 12/2003 | Moon | ................... | G09G 3/3685 377/64 |
| 2006/0007085 A1* | 1/2006 | Kim | ..................... | G09G 3/3677 345/87 |
| 2008/0001879 A1* | 1/2008 | Wu | ....................... | G09G 3/3413 345/88 |
| 2008/0079001 A1* | 4/2008 | Umezaki | ................ | H01L 27/12 257/59 |
| 2011/0142191 A1* | 6/2011 | Tobita | .................. | G11C 19/184 377/64 |

* cited by examiner

Primary Examiner — Shaheda Abdin
(74) Attorney, Agent, or Firm — Soroker Agmon Nordman

(57) ABSTRACT

A scan driving circuit is provided for driving scan line in cascade, including a pull-down controlling module, a pull-down module, a reset-controlling module, a resetting module, a downward-transferring module, a first bootstrap capacitor, a constant low voltage level source, and a constant high voltage level source. By disposing the resetting module, the scan driving circuit of the present invention raises the reliability of the scan driving circuit and simplifies the entire structure of the scan driving circuit.

16 Claims, 5 Drawing Sheets

SCAN DRIVING CIRCUIT

FIELD OF THE INVENTION

The present invention relates to the field of driving display, and more particularly to a scan driving circuit.

BACKGROUND OF THE INVENTION

Gate driver on array (called "GOA") is a technology of forming a scan driving circuit on an array substrate of a conventional thin film transistor liquid crystal display, in order to implement a driving manner that scan lines are scanned row by row. The conventional scan driving circuit comprises a pull-down controlling module, a pull-down module, a downward-transferring module, a reset-controlling module, a bootstrap capacitor, and a reset-controlling module.

When the scan driving circuit works under high temperatures, the problems of time delays and current leakage may occur, thereby influencing the reliability of the scan driving circuit.

Accordingly, it is necessary to provide a scan driving circuit to solve the technical problem in the prior art.

SUMMARY OF THE INVENTION

An object of the present invention is to provide a scan driving circuit with a simplified structure and a high reliability so as to solve the problems that the conventional scan driving circuit has a complex structure and low reliability.

In order to solve the above-mentioned problems, the technical solution of the present invention is as follows.

In an embodiment of the present invention, a scan driving circuit for driving scan line in cascade is provided, comprising:

a pull-down controlling module for receiving a scan signal of a previous stage and generating a scan voltage signal having a low voltage level in the corresponding scan line according to the scan signal of the previous stage;

a pull-down module for pulling down a scan signal of the corresponding scan line according to the scan voltage signal;

a reset-controlling module for receiving a clock signal of a next stage and generating a reset signal of the corresponding scan line according to the clock signal of the next stage;

a resetting module for pulling up the scan signal of the corresponding scan line according to the reset signal;

a downward-transferring module for generating and transmitting a clock signal of a present stage according to the scan signal of the scan line;

a first bootstrap capacitor for generating the scan voltage signal having either the low voltage level or a high voltage level in the scan line;

a constant low voltage level source for providing a low voltage level signal; and a constant high voltage level source for providing a high voltage level signal.

The resetting module comprises a fourth transistor, a fifth transistor, a sixth transistor, a seventh transistor, and an eleventh transistor.

The reset signal is inputted into a control terminal of the fourth transistor; an input terminal of the fourth transistor is connected with the constant low voltage level source, and an output terminal of the fourth transistor is connected with an output terminal of the sixth transistor.

A control terminal of the fifth transistor is connected with the output terminal of the sixth transistor, an input terminal of the fifth transistor is connected with the constant high voltage level source, and an output terminal of the fifth transistor is connected with an output of the pull-down module.

A control terminal of the sixth transistor is connected with an output terminal of the eleventh transistor, and an input terminal of the sixth transistor is connected with the constant high voltage level source.

A control terminal of the seventh transistor is connected with the output terminal of the sixth transistor, an input terminal of the seventh transistor is connected with the constant high voltage level source, and an output terminal of the seventh transistor is connected with an output terminal of the scan line which outputs the scan signal.

A control terminal of the eleventh transistor is connected with the constant low voltage level source, an input terminal of the eleventh transistor is connected with the pull-down module, and the output terminal of the eleventh transistor is connected with the control terminal of the sixth transistor.

The resetting module further comprises a second bootstrap capacitor, a terminal of the second bootstrap capacitor is connected with the constant high voltage level source, and another terminal of the second bootstrap capacitor is connected with the output terminal of the fourth transistor.

The scan driving circuit utilizes either P-type metal-oxide semiconductor transistors or N-type metal-oxide semiconductor transistors to control the pull-down controlling module, the pull-down module, the resetting module, the reset-controlling module, and the downward-transferring module.

In the scan driving circuit of the present invention, the pull-down controlling module is further used for receiving a scan signal of the next stage and generating the scan voltage signal having the low voltage level in the corresponding scan line according to the scan signal of the next stage.

The reset-controlling module is further used for receiving a clock signal of the previous stage and generating the reset signal of the corresponding scan line according to the clock signal of the previous stage.

In the scan driving circuit of the present invention, the pull-down controlling module comprises a first transistor and a second transistor.

A first scan signal is inputted into a control terminal of the first transistor, the scan signal of the previous stage is inputted into an input terminal of the first transistor, and an output terminal of the first transistor is connected with the pull-down module.

A second scan signal is inputted into a control terminal of the second transistor, the scan signal of the next stage is inputted into an input terminal of the second transistor, and an output terminal of the second transistor is connected with the pull-down module.

In the scan driving circuit of the present invention, the reset-controlling module comprises an eighth transistor and a ninth transistor.

A first scan signal is inputted into a control terminal of the eighth transistor, the clock signal of the next stage is inputted into an input terminal of the eighth transistor, and an output terminal of the eighth transistor is connected with the control terminal of the fourth transistor.

A second scan signal is inputted into a control terminal of the ninth transistor, the clock signal of the previous stage is inputted into an input terminal of the ninth transistor, and an output terminal of the ninth transistor is connected with the control terminal of the fourth transistor.

In the scan driving circuit of the present invention, the pull-down module comprises a third transistor, an input terminal of the third transistor is connected with the pull-down controlling module, a control terminal of the third transistor is connected with the pull-down controlling module, and an output terminal of the third transistor is connected with the output terminal of the fifth transistor.

In the scan driving circuit of the present invention, the downward-transferring module comprises a tenth transistor, a control terminal of the tenth transistor is respectively connected with the resetting module and the pull-down module, an input terminal of the tenth transistor is connected with the output terminal of the seventh transistor, and an output terminal of the tenth transistor outputs the clock signal of the present stage.

In the scan driving circuit of the present invention, the downward-transferring module further comprises a thirteenth transistor, a control terminal of the thirteenth transistor is connected with the control terminal of the tenth transistor, an input terminal of the thirteenth transistor is connected with the output terminal of the tenth transistor, and an output terminal of the thirteenth transistor outputs a cascaded signal of the present stage.

The resetting module further comprises a twelfth transistor, a cascaded signal of the previous stage is inputted into a control terminal of the twelfth transistor, an input terminal of the twelfth transistor is connected with the constant high voltage level source, and an output terminal of the twelfth transistor is connected with the control terminal of the fifth transistor.

The pull-down module comprises a third transistor, an input terminal of the third transistor is connected with the pull-down controlling module, the cascaded signal of the previous stage is inputted into a control terminal of the third transistor, and an output terminal of the third transistor is connected with the output terminal of the fifth transistor.

In the scan driving circuit of the present invention, the resetting module further comprises a twelfth transistor, a control terminal of the twelfth transistor is connected with the pull-down controlling module, an input terminal of the twelfth transistor is connected with the constant high voltage level source, and an output terminal of the twelfth transistor is connected with the control terminal of the fifth transistor.

The present invention also provides a scan driving circuit for driving scan line in cascade, comprising:

a pull-down controlling module for receiving a scan signal of a previous stage and generating a scan voltage signal having a low voltage level in the corresponding scan line according to the scan signal of the previous stage;

a pull-down module for pulling down a scan signal of the corresponding scan line according to the scan voltage signal;

a reset-controlling module for receiving a clock signal of a next stage and generating a reset signal of the corresponding scan line according to the clock signal of the next stage;

a resetting module for pulling up the scan signal of the corresponding scan line according to the reset signal;

a downward-transferring module for generating and transmitting a clock signal of a present stage according to the scan signal of the scan line;

a first bootstrap capacitor for generating the scan voltage signal having either the low voltage level or a high voltage level in the scan line;

a constant low voltage level source for providing a low voltage level signal; and a constant high voltage level source for providing a high voltage level signal.

The resetting module comprises a fourth transistor, a fifth transistor, a sixth transistor, a seventh transistor, and an eleventh transistor.

The reset signal is inputted into a control terminal of the fourth transistor; an input terminal of the fourth transistor is connected with the constant low voltage level source, and an output terminal of the fourth transistor is connected with an output terminal of the sixth transistor.

A control terminal of the fifth transistor is connected with the output terminal of the sixth transistor, an input terminal of the fifth transistor is connected with the constant high voltage level source, and an output terminal of the fifth transistor is connected with an output of the pull-down module.

A control terminal of the sixth transistor is connected with an output terminal of the eleventh transistor, and an input terminal of the sixth transistor is connected with the constant high voltage level source.

A control terminal of the seventh transistor is connected with the output terminal of the sixth transistor, an input terminal of the seventh transistor is connected with the constant high voltage level source, and an output terminal of the seventh transistor is connected with an output terminal of the scan line which outputs the scan signal.

A control terminal of the eleventh transistor is connected with the constant low voltage level source, an input terminal of the eleventh transistor is connected with the pull-down module, and the output terminal of the eleventh transistor is connected with the control terminal of the sixth transistor.

In the scan driving circuit of the present invention, the pull-down controlling module is further used for receiving a scan signal of the next stage and generating the scan voltage signal having the low voltage level in the corresponding scan line, according to the scan signal of the next stage.

The reset-controlling module is further used for receiving a clock signal of the previous stage and generating the reset signal of the corresponding scan line according to the clock signal of the previous stage.

In the scan driving circuit of the present invention, the pull-down controlling module comprises a first transistor and a second transistor.

A first scan signal is inputted into a control terminal of the first transistor, the scan signal of the previous stage is inputted into an input terminal of the first transistor, and an output terminal of the first transistor is connected with the pull-down module.

A second scan signal is inputted into a control terminal of the second transistor, the scan signal of the next stage is inputted into an input terminal of the second transistor, and an output terminal of the second transistor is connected with the pull-down module.

In the scan driving circuit of the present invention, the reset-controlling module comprises an eighth transistor and a ninth transistor.

A first scan signal is inputted into a control terminal of the eighth transistor, the clock signal of the next stage is inputted into an input terminal of the eighth transistor, and an output terminal of the eighth transistor is connected with the control terminal of the fourth transistor.

A second scan signal is inputted into a control terminal of the ninth transistor, the clock signal of the previous stage is inputted into an input terminal of the ninth transistor, and an output terminal of the ninth transistor is connected with the control terminal of the fourth transistor.

In the scan driving circuit of the present invention, the pull-down module comprises a third transistor, an input terminal of the third transistor is connected with the pull-down controlling module, a control terminal of the third transistor is connected with the pull-down controlling module, and an output terminal of the third transistor is connected with the output terminal of the fifth transistor.

In the scan driving circuit of the present invention, the downward-transferring module comprises a tenth transistor, a control terminal of the tenth transistor is respectively connected with the resetting module and the pull-down module, an input terminal of the tenth transistor is connected with the output terminal of the seventh transistor, and an output terminal of the tenth transistor outputs the clock signal of the present stage.

In the scan driving circuit of the present invention, the downward-transferring module further comprises a thirteenth transistor, a control terminal of the thirteenth transistor is connected with the control terminal of the tenth transistor, an input terminal of the thirteenth transistor is connected with the output terminal of the tenth transistor, and an output terminal of the thirteenth transistor outputs a cascaded signal of the present stage.

The resetting module further comprises a twelfth transistor, a cascaded signal of the previous stage is inputted into a control terminal of the twelfth transistor, an input terminal of the twelfth transistor is connected with the constant high voltage level source, and an output terminal of the twelfth transistor is connected with the control terminal of the fifth transistor.

The pull-down module comprises a third transistor, an input terminal of the third transistor is connected with the pull-down controlling module, the cascaded signal of the previous stage is inputted into a control terminal of the third transistor, and an output terminal of the third transistor is connected with the output terminal of the fifth transistor.

In the scan driving circuit of the present invention, the resetting module further comprises a twelfth transistor, a control terminal of the twelfth transistor is connected with the pull-down controlling module, an input terminal of the twelfth transistor is connected with the constant high voltage level source, and an output terminal of the twelfth transistor is connected with the control terminal of the fifth transistor.

In the scan driving circuit of the present invention, the resetting module further comprises a second bootstrap capacitor; a terminal of the second bootstrap capacitor is connected with the constant high voltage level source, and another terminal of the second bootstrap capacitor is connected with the output terminal of the fourth transistor.

In the scan driving circuit of the present invention, the scan driving circuit utilizes either P-type metal-oxide semiconductor transistors or N-type metal-oxide semiconductor transistors to control the pull-down controlling module, the pull-down module, the resetting module, the reset-controlling module, and the downward-transferring module.

In comparison to the prior art, the scan driving circuit of the present invention can increase the reliability and simplify the structure by disposing the resetting module so as to solve the technical problems that the conventional scan driving circuit has a complex structure and low reliability.

In order to make the present invention more clear, preferred embodiments and the drawings thereof are described in detail below.

DETAILED DESCRIPTION OF THE INVENTION

Figure 1:
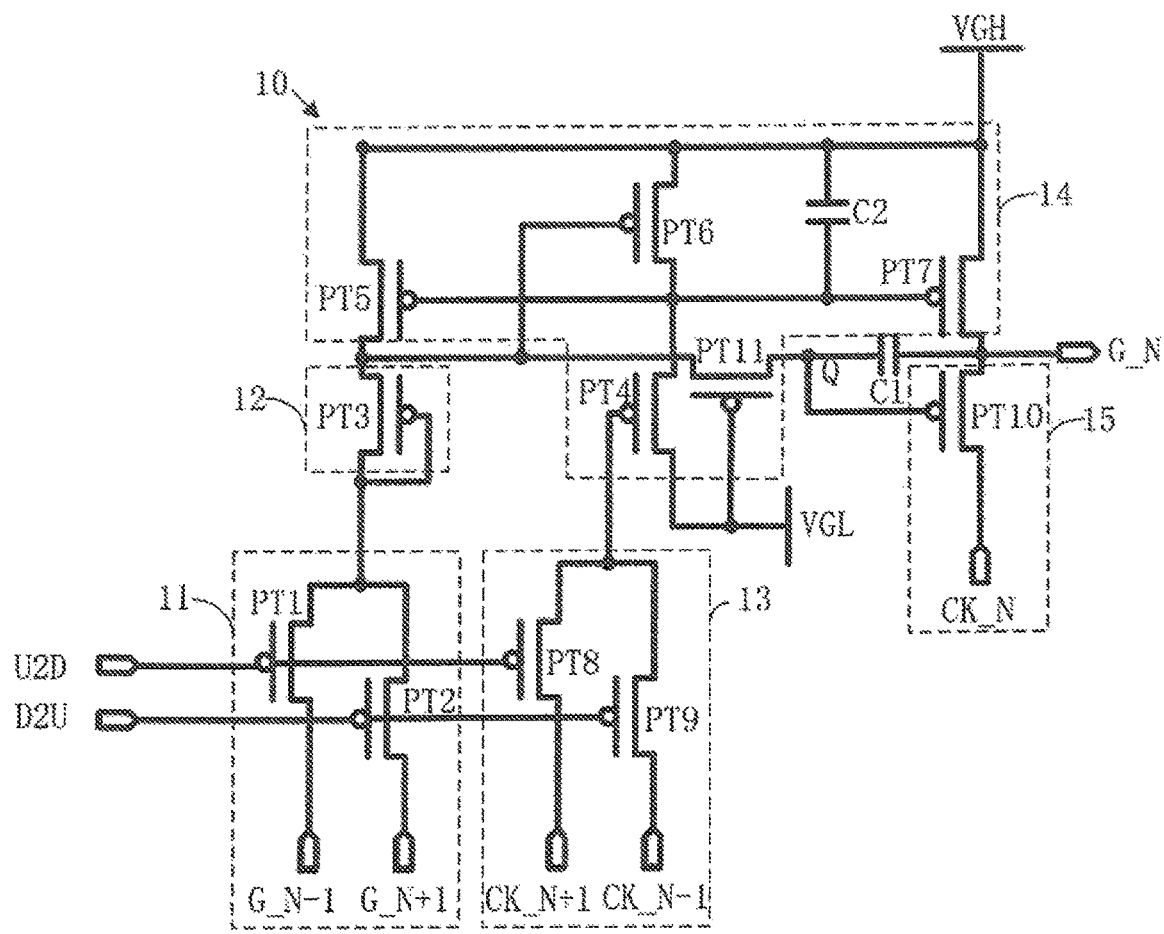
FIG. 1 is a structural diagram of a scan driving circuit of a preferred embodiment of the present invention.

The following embodiments refer to the accompanying drawings for exemplifying specific implementable embodiments of the present invention. Furthermore, directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

In the drawings, the same reference symbol represents the same or similar components.

Please refer to FIG. 1, which shows a structural diagram of a scan driving circuit of a first preferred embodiment of the present invention. In the preferred embodiment of the present invention, the scan driving circuit is used for driving scan line in cascade. The scan driving circuit 10 comprises a pull-down controlling module 11, a pull-down module 12, a reset-controlling module 13, a resetting module 14, a downward-transferring module 15, a first bootstrap capacitor C1, a constant low voltage level source VGL, and a constant high voltage level source VGH.

The pull-down controlling module 11 is used for receiving a scan signal G_N−1 of a previous stage and generating a scan voltage signal having a low voltage level in the corresponding scan line, according to the scan signal G_N−1 of the previous stage, or otherwise used for receiving a scan signal G_N+1 of a next stage and generating the scan voltage signal having the low voltage level in the corresponding scan line, according to the scan signal G_N+1 of the next stage. The pull-down module 12 is used for pulling down a scan signal G_N of the corresponding scan line, according to the scan voltage signal. The reset-controlling module 13 is used for receiving a clock signal CK_N+1 of the next stage and generating a reset signal of the corresponding scan line, according to the clock signal CK_N+1 of the next stage, or otherwise used for receiving a clock signal CK_N−1 of the previous stage and generating the reset signal of the corresponding scan line, according to the clock signal CK_N−1 of the previous stage. The resetting module 14 is used for pulling up the scan signal G_N of the corresponding scan line, according to the reset signal. The downward-transferring module 15 is used for generating and transmitting a clock signal CK_N of a present stage, according to the scan signal G_N of the scan line. The first bootstrap capacitor C1 is used for generating the scan voltage signal having either the low voltage level or a high voltage level in the scan line. The constant low voltage level source VGL is used for providing a low voltage level signal. The constant high voltage level source VGH is used for providing a high voltage level signal.

In the preferred embodiment of the present invention, the pull-down controlling module 11 of the scan driving circuit 10 comprises a first transistor PT1 and a second transistor PT2. A first scan signal U2D is inputted into a control terminal of the first transistor PT1. The scan signal G_N−1 of the previous stage is inputted into an input terminal of the first transistor PT1. An output terminal of the first transistor PT1 is connected with the pull-down module 12. A second scan signal D2U is inputted into a control terminal of the second transistor PT2. The scan signal G_N+1 of the next stage is inputted into an input terminal of the second transistor PT2. An output terminal of the second transistor PT2 is connected with the pull-down module 12.

The pull-down module 12 comprises a third transistor PT3. An input terminal of the third transistor PT3 is connected with the pull-down controlling module 11. A control terminal of the third transistor PT3 is connected with the pull-down controlling module 11. An output terminal of the third transistor PT3 is connected with an output terminal of a fifth transistor PT5 of the resetting module 14.

The reset-controlling module 13 comprises an eighth transistor PT8 and a ninth transistor PT9. The first scan signal U2D is inputted into a control terminal of the eighth transistor PT8. The clock signal CK_N+1 of the next stage is inputted into an input terminal of the eighth transistor PT8. An output terminal of the eighth transistor PT8 is connected with a control terminal of a fourth transistor PT4 of the resetting module 14 so as to output the reset signal. The second scan signal D2U is inputted into a control terminal of the ninth transistor PT9. The clock signal CK_N−1 of the previous stage is inputted into an input terminal of the ninth transistor PT9. An output terminal of the ninth transistor PT9 is connected with the control terminal of the fourth transistor PT4 of the resetting module 14 so as to output the reset signal.

The resetting module 14 comprises the fourth transistor PT4, the fifth transistor PT5, a sixth transistor PT6, a seventh transistor PT7, and an eleventh transistor PT11, and a second bootstrap capacitor C2.

The reset signal is inputted into the control terminal of the fourth transistor PT4. An input terminal of the fourth transistor PT4 is connected with the constant low voltage level source VGL. An output terminal of the fourth transistor PT4 is connected with an output terminal of the sixth transistor PT6.

A control terminal of the fifth transistor PT5 is connected with the output terminal of the sixth transistor PT6. The input terminal of the fifth transistor PT5 is connected with the constant high voltage level source VGH. An output terminal of the fifth transistor PT5 is connected with the output terminal of the third transistor PT3 of the pull-down module 12.

A control terminal of the sixth transistor PT6 is connected with the output terminal of the third transistor PT3. An input terminal of the sixth transistor PT6 is connected with the constant high voltage level source VGH.

A control terminal of the seventh transistor PT7 is connected with the output terminal of the sixth transistor PT6. An input terminal of the seventh transistor PT7 is connected with the constant high voltage level source VGH. An output terminal of the seventh transistor PT7 is connected with an output terminal of the scan line which outputs the scan signal.

A control terminal of the eleventh transistor PT11 is connected with the constant low voltage level source VHL. An input terminal of the eleventh transistor PT11 is connected with the output terminal of the third transistor PT3 of the pull-down module 12. The scan signal of the present stage of the scan line is outputted from an output terminal of the eleventh transistor PT11 via the first bootstrap capacitor C1.

A terminal of the second bootstrap capacitor C2 is connected with the constant high voltage level source VGH, and another terminal of the second bootstrap capacitor C2 is connected with the output terminal of the fourth transistor PT4.

The downward-transferring module 15 comprises a tenth transistor PT10. A control terminal of the tenth transistor PT10 is connected with the output terminal of the eleventh transistor PT11. An input terminal of the tenth transistor PT10 is connected with the output terminal of the seventh transistor PT7. An output terminal of the tenth transistor PT10 outputs the clock signal CK_N of the present stage.

In the scan driving circuit 10 of the preferred embodiment, each cycle comprises four clock signals CK_N. That is, the CK_N is same as the CK_N+4 in waveform. Firstly, the previous stage outputs a scan signal G_N−1 having the low voltage level, and the first transistor PT1 of the pull-down controlling module 11 is turned on under the control of the scan signal D2U having the low voltage level. Hence, the output terminal of the first transistor PT1 outputs the scan signal G_N−1 of the previous stage to the input terminal of the third transistor PT3 of the pull-down module 12. In the meanwhile, since the phase of the scan signal D2U is inverted to the scan signal U2D, the second transistor PT2 is turned off under the control of the scan signal U2D having the high voltage level.

The scan signal G_N−1 having the low voltage level from the previous stage is inputted into the control terminal of the third transistor PT3 of the pull-down module 12, the third transistor PT3 is thus turned on, and the output terminal of the third transistor PT3 outputs the low voltage level signal G_N−1.

The control terminal of the sixth transistor PT6 of the resetting module 14 receives the low voltage level signal G_N−1 outputted by the output terminal of the third transistor PT3, and the sixth transistor PT6 is thus turned on. The control terminal of the fifth transistor PT5 and the control terminal of the seventh transistor PT7 are respectively connected with the constant high voltage level source VGH via the sixth transistor PT6. Therefore, the control terminal of the fifth transistor PT5 and the seventh transistor PT7 are turned off.

The eleventh transistor PT11 of the resetting module 14 is turned on under the control of the constant low voltage level source VGL. The low voltage level signal G_N−1 outputted by the third transistor PT3 of the pull-down module 12 actuates the first bootstrap capacitor C1 through the eleventh transistor PT11, so that the voltage level at a Q point is pulled down, and the G_N therefore outputs a low voltage level signal. In the meanwhile, the tenth transistor PT10 of the downward-transferring module 15 is turned on under the control of the voltage level of the Q point. The output terminal of the tenth transistor PT10 outputs the clock signal CK_N having the low voltage level in the present stage to a drive circuit of a scan line in the previous stage.

When the clock signal CK_N+1 of the next stage is converted to the low voltage level, the clock signal CK_N+1 of the next stage is inputted into the eighth transistor PT8 of the reset-controlling module 13 under the control of the first scan signal U2D, and the output terminal of the eighth transistor PT8 outputs the clock signal CK_N+1 (i.e., the reset signal) to the control terminal of the fourth transistor PT4.

The fourth transistor PT4 of the resetting module 14 is turned on under the control of the reset signal. The constant low voltage level source VGL passes through the fourth transistor PT4 to the control terminal of the fifth transistor PT5 and the control terminal of the seventh transistor PT7, so that the fifth transistor PT5 and the seventh transistor PT7 are turned on. The high voltage level signal from the constant high voltage level source VGH passes through the fifth transistor PT5 to the Q point so as to pull up the voltage level at the Q point. Moreover, the high voltage level signal from the constant high voltage level source VGH passes through the seventh transistor PT7 to the G_N so as to pull up the G_N. Since the tenth transistor PT10 is turned off, the clock signal CK_N is converted to the high voltage level.

Thus, the cascade outputting process of the scan signal in the scan driving circuit 10 of the preferred embodiment is accomplished.

Preferably, the voltage levels on the control terminal of the fifth transistor PT5 and the control terminal of the seventh transistor PT7 can be advantageously pulled up by disposing the second bootstrap capacitor C2 of the resetting module 14, thereby ensuring that the Q point is kept at the low voltage level.

Preferably, in the preferred embodiment, the reset-controlling module 13 also comprises a ninth transistor PT9. The second scan signal D2U is inputted into the control terminal of the ninth transistor PT9. The clock signal CK_N−1 of the previous stage is inputted into the input terminal of the ninth transistor PT9. The output terminal of the fourth transistor PT4 outputs the reset signal of the scan line to the sixth transistor PT6. Therefore, the reset-controlling module 13 can receive the clock signal CK_N−1 of the previous stage and generate the reset signal of the corresponding scan line, according to the clock signal CK_N−1 of the previous stage.

Accordingly, in the preferred embodiment, the scan driving circuit 10 can implement a reverse scan function by using the second transistor PT2 and the ninth transistor PT9.

Preferably, in the preferred embodiment, the scan driving circuit 10 utilizes P-type metal-oxide semiconductor transistors to control the pull-down controlling module 11, the pull-down module 12, the reset-controlling module 13, the resetting module 14, and the downward-transferring module 15. Alternatively, the scan driving circuit 10 can also utilize N-type metal-oxide semiconductor transistors herein to control the pull-down controlling module 11, the pull-down module 12, the reset-controlling module 13, the resetting module 14, and the downward-transferring module 15.

In the scan driving circuit of the present invention, by disposing each of the modules, the reliability of the scan driving circuit is increased, and the structure of the scan driving circuit is simplified.

Figure 2A:
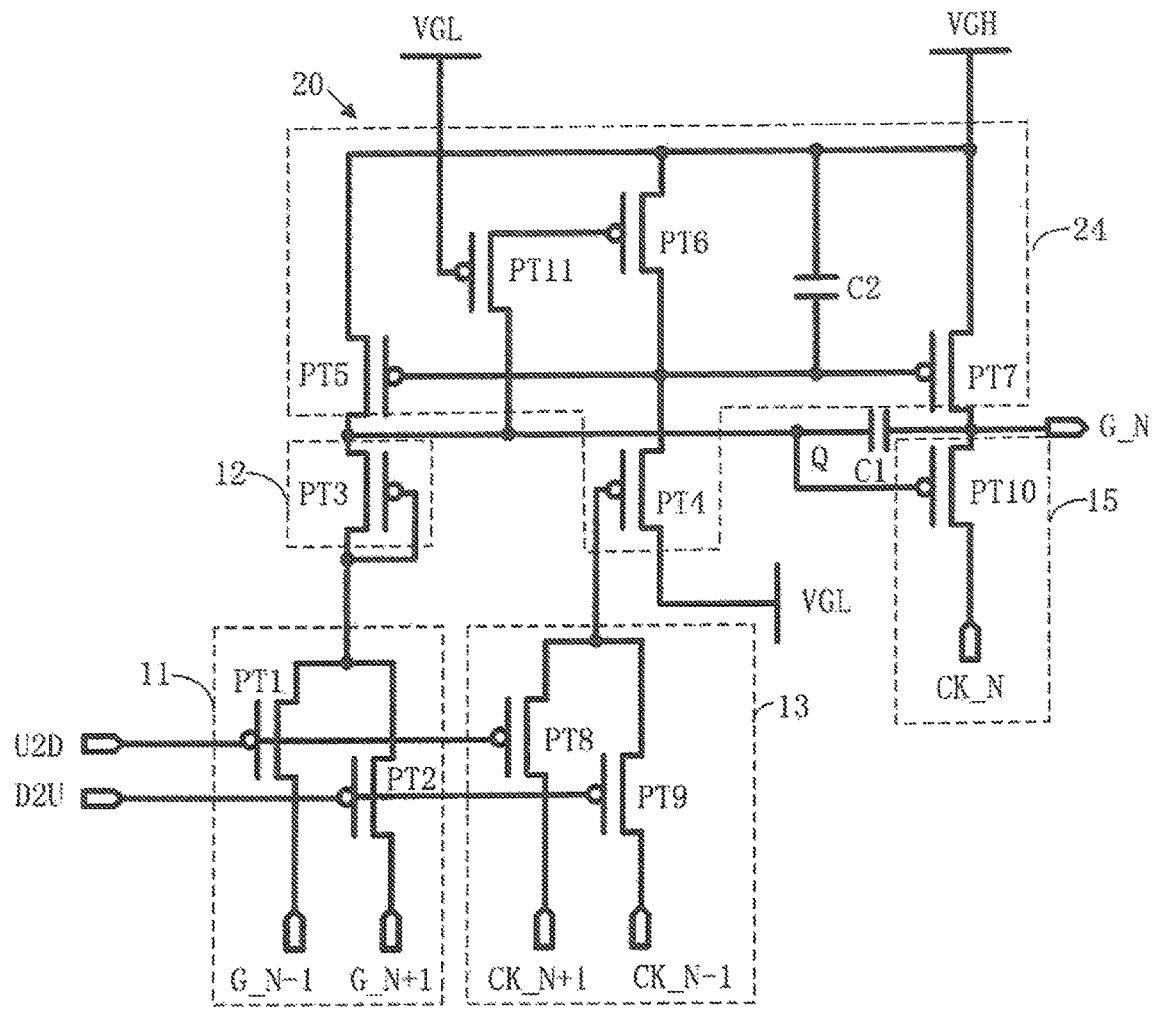
FIG. 2A is a structural diagram of a scan driving circuit of a second preferred embodiment of the present invention.
Figure 2B:
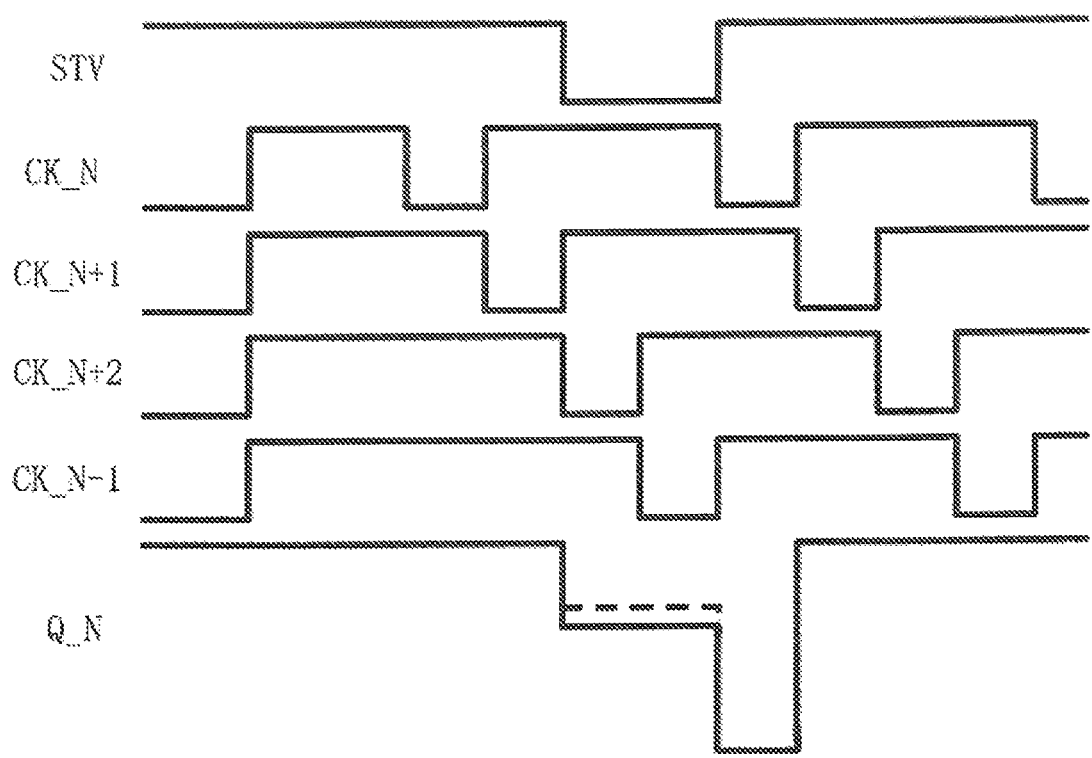
FIG. 2B is a signal waveform diagram of the scan driving circuits of the first and second preferred embodiments of the present invention.

Please refer to FIG. 2A and FIG. 2B. FIG. 2A is a structure diagram of a scan driving circuit of a second preferred embodiment of the present invention, and FIG. 2B is a signal waveform diagram of the scan driving circuits of the first and second preferred embodiments of the present invention. In the scan driving circuit 10 of the first preferred embodiment, the voltage level at the Q point may not be sufficiently pulled down due to the voltage division principle of the eleventh transistor PT11 of the resetting module 14 of the scan driving circuit 10, as shown on the dashed line portion of FIG. 2B. If the voltage level at the Q point is over high, the scan driving circuit 10 of the preferred embodiment may malfunction.

Therefore, on the basis of the first preferred embodiment, the position of the eleventh transistor PT11 of the resetting module 24 of the scan driving circuit 20 of the second preferred embodiment is rearranged. The control terminal of the eleventh transistor PT11 is connected with the constant low voltage level source VGL. The input terminal of the eleventh transistor PT11 is connected with the output terminal of the third transistor PT3 of the pull-down module 12. The output terminal of the eleventh transistor PT11 is connected with the control terminal of the sixth transistor PT6.

Thus, the scan signal of the present stage of the scan line is directly outputted from the output terminal of the third transistor PT3, via the first bootstrap capacitor C1. When the Q point is pulled down, the internal resistance of the eleventh transistor PT11 will not pull up the voltage level at the Q point, thereby preventing the voltage level at the Q point being virtual-high, and preventing the voltage division principle and the current limiting principle of the eleventh transistor PT11 which causes the drawback that the Q point cannot be effectively charged up (pulled down), as shown by the solid line portion of FIG. 2B, thereby increasing the reliability of the scan driving circuit 20.

The working principle of the scan driving circuit 20 of the second preferred embodiment is the same as or similar to the above mentioned scan driving circuit 10 of the first preferred embodiment, so please refer to the above mentioned description with respect to the scan driving circuit 10 of the first preferred embodiment.

In the scan driving circuit of the second preferred embodiment, the reliability of scan driving circuit is increased by the arrangement the eleventh transistor of the resetting module.

Figure 3:
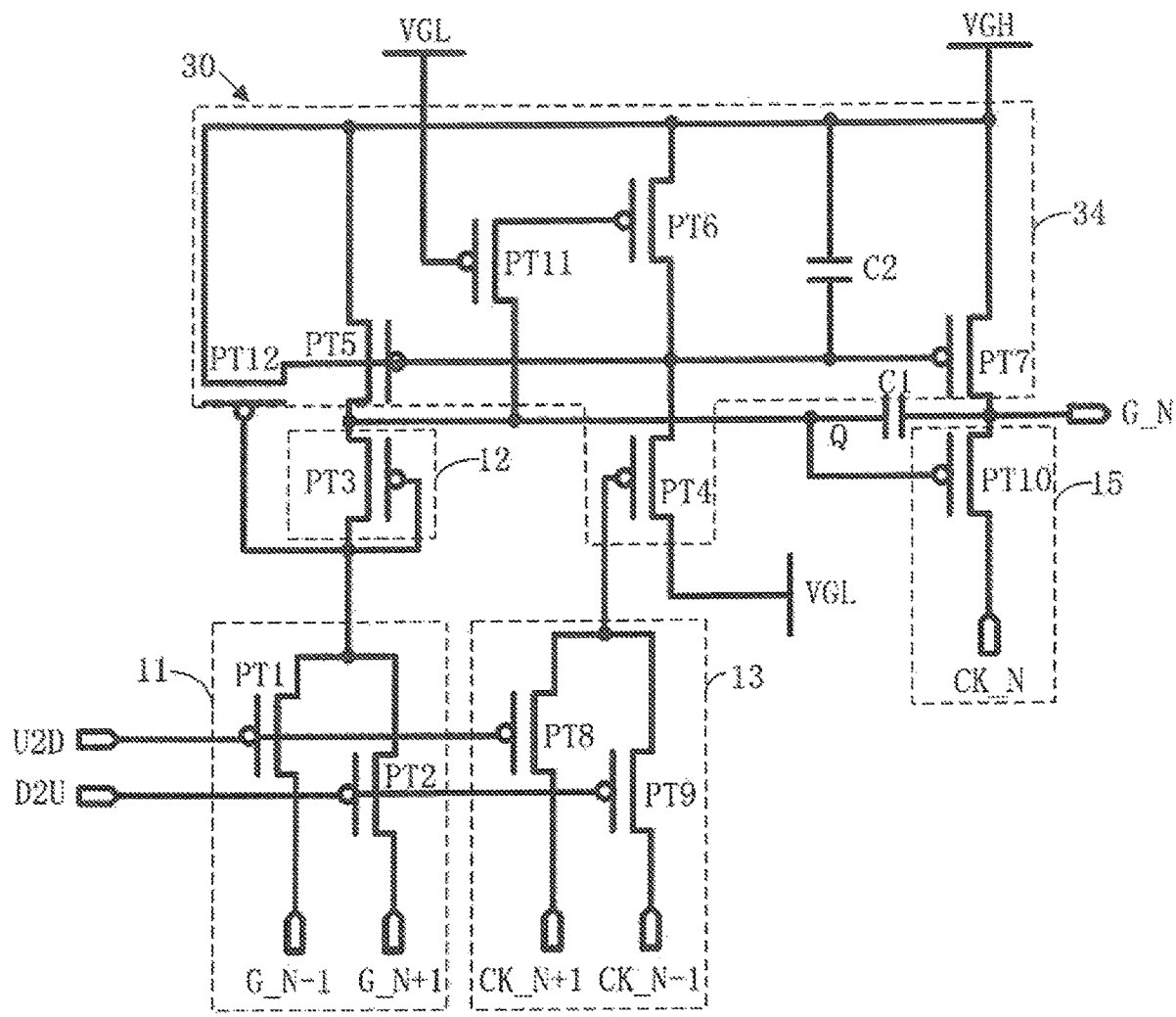
FIG. 3 is a structural diagram of a scan driving circuit of a third preferred embodiment of the present invention.

Please refer to FIG. 3, which shows a structure diagram of a scan driving circuit of a third preferred embodiment of the present invention. On the basis of the second preferred embodiment, the scan driving circuit 30 of the third preferred embodiment also comprises a twelfth transistor PT12. A control terminal of the twelfth transistor PT12 is connected with the output of the pull-down controlling module 11. That is, the output terminal of the first transistor PT1 is connected with the output terminal of the second transistor PT2. An input terminal of the twelfth transistor PT12 is connected with the constant high voltage level source VGH. An output terminal of the twelfth transistor PT12 is connected with the control terminal of the fifth transistor PT5.

In the scan driving circuit 30 of the preferred embodiment, for ensuring that the fifth transistor PT5 and the seventh transistor PT7 are turned off, the twelfth transistor PT12 is turned on under the control of the scan signal G_N−1 of the previous stage, which is acquired by the pull-down controlling module 11, so that the control terminal of the fifth transistor PT5 and the control terminal of the seventh transistor PT7 are respectively connected with the constant high voltage level source VGH.

The working principle of the scan driving circuit 30 of the third preferred embodiment is the same as or similar to the above mentioned scan driving circuit 20 of the second preferred embodiment, so please refer to the above mentioned description with respect to the scan driving circuit 20 of the second preferred embodiment.

On the basis of the second preferred embodiment, the reliability of scan driving circuit of the third preferred embodiment is increased by the arrangement the twelfth transistor.

Figure 4:
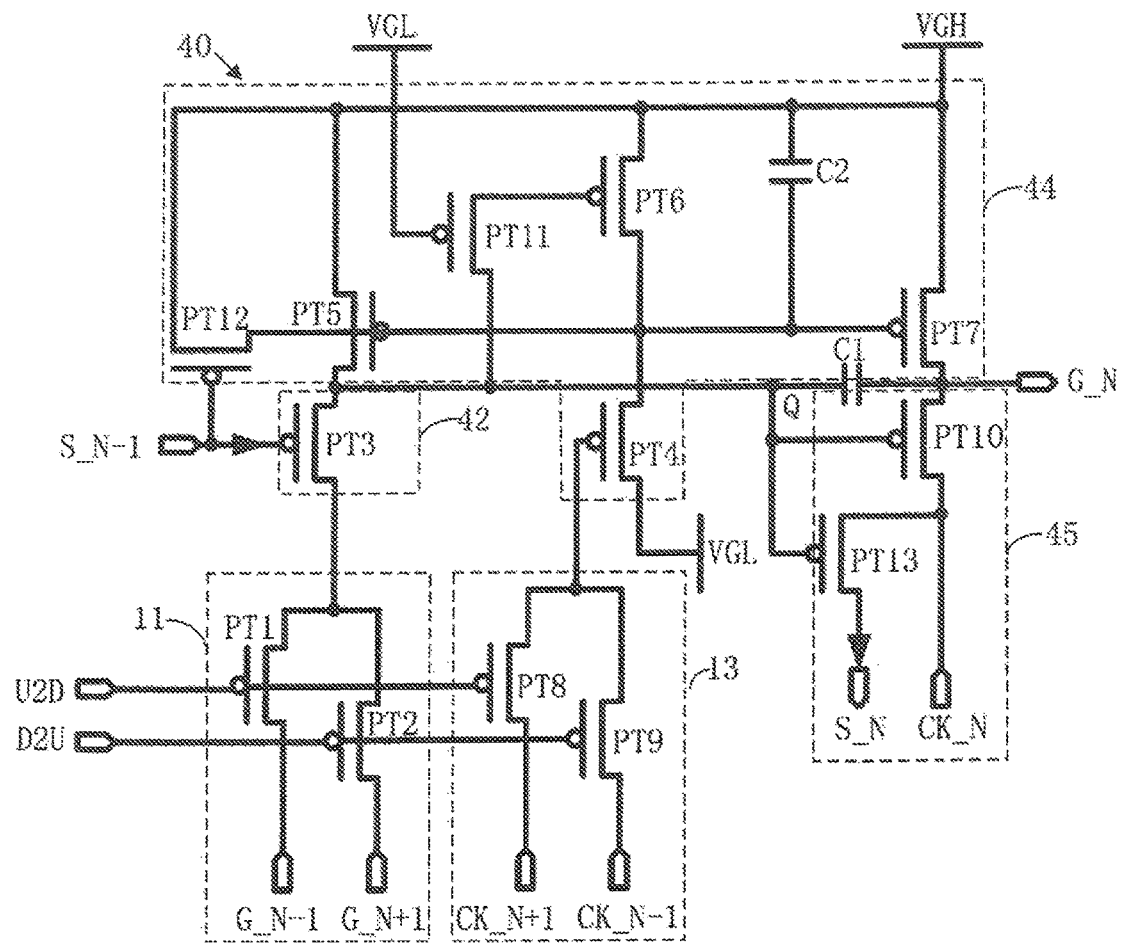
FIG. 4 is a structural diagram of a scan driving circuit of a fourth preferred embodiment of the present invention.

Please refer to FIG. 4, which shows a structure diagram of a scan driving circuit of a fourth preferred embodiment of the present invention. On the basis of the second preferred embodiment, the scan driving circuit 40 of the fourth preferred embodiment also comprises a thirteenth transistor PT13. A control terminal of the thirteenth transistor PT13 is connected with the control terminal of the tenth transistor PT10. An input terminal of the thirteenth transistor PT13 is connected with the output terminal of the tenth transistor PT10. The output terminal of the thirteenth transistor PT13 outputs a cascaded signal S_N of the present stage.

The resetting module 44 also comprises the twelfth transistor PT12. A cascaded signal S_N−1 of the previous stage is inputted into the control terminal of the twelfth transistor PT12. The input terminal of the twelfth transistor PT12 is connected with the constant high voltage level source VGH. The output terminal of the twelfth transistor PT12 is connected with the control terminal of the fifth transistor PT5.

The pull-down module 42 comprises the third transistor PT3. The input terminal of the third transistor PT3 is connected with the output of the pull-down controlling module 11. The cascaded signal S_N−1 of the previous stage is inputted into the control terminal of the third transistor PT3. The output terminal of the third transistor PT3 is connected with the output terminal of the fifth transistor PT5.

In the scan driving circuit 40 of the preferred embodiment, for ensuring that the twelfth transistor PT12 and the third transistor PT3 can be promptly turned on, the twelfth transistor PT12 and the third transistor PT3 are turned on or turned off under the control of the cascaded signal S_N−1 of the previous stage. Moreover, the downward-transferring module 45 also generates a cascaded signal S_N of the present stage, so as to transmit the cascaded signal S_N to the driving circuit of the scan line in the previous stage, thereby preventing the internal resistance of the transistor from influencing a turn on signal or a turn off signal, so as to increase the stability and the reliability of the scan driving circuit 40.

The working principle of the scan driving circuit 40 of the fourth preferred embodiment is the same as or similar to the above mentioned scan driving circuit 30 of the third preferred embodiment, so please refer to the above mentioned description with respect to the scan driving circuit 30 of the third preferred embodiment.

On the basis of the third preferred embodiment, the reliability of scan driving circuit of the fourth preferred embodiment is increased by providing the cascaded signal.

In the scan driving circuit of the present invention, by disposing the resetting module, the reliability of the scan driving circuit is increased, and the entire structure of the scan driving circuit is simple, so as to solve the technical problems that the conventional scan driving circuit has a complex structure and low reliability.

The above descriptions are merely preferred embodiments of the present invention, and are not intended to limit the scope of the present invention. Any modification or replacement made by those skilled in the art without departing from the spirit and principle of the present invention should fall within the protection scope of the present invention. Therefore, the protection scope of the present invention is subject to the appended claims.

What is claimed is:

1. A scan driving circuit for driving scan line in cascade, comprising:
    a pull-down controlling module for receiving a scan signal of a previous stage and generating a scan voltage signal having a low voltage level in the corresponding scan line, according to the scan signal of the previous stage;
    a pull-down module for pulling down a scan signal of the corresponding scan line according to the scan voltage signal;
    a reset-controlling module for receiving a clock signal of a next stage and generating a reset signal of the corresponding scan line according to the clock signal of the next stage;
    a resetting module for pulling up the scan signal of the corresponding scan line according to the reset signal;
    a downward-transferring module for generating and transmitting a clock signal of a present stage according to the scan signal of the scan line;
    a first bootstrap capacitor for generating the scan voltage signal having either the low voltage level or a high voltage level in the scan line;
    a constant low voltage level source for providing a low voltage level signal; and a constant high voltage level source for providing a high voltage level signal, wherein the resetting module comprises a fourth transistor, a fifth transistor, a sixth transistor, a seventh transistor, and an eleventh transistor; the reset signal is inputted into a control terminal of the fourth transistor; an input terminal of the fourth transistor is connected with the constant low voltage level source, and an output terminal of the fourth transistor is connected with an output terminal of the sixth transistor;
    a control terminal of the fifth transistor is connected with the output terminal of the sixth level source, and an output terminal of the fifth transistor is connected with an output of the pull-down module;
    a control terminal of the sixth transistor is connected with an output terminal of the eleventh transistor, and an input terminal of the sixth transistor is connected with the constant high voltage level source; a control terminal of the seventh transistor is connected with the output terminal of the sixth transistor, an input terminal of the seventh transistor is connected with the constant high voltage level source, and an output terminal of the seventh transistor is connected with an output terminal of the scan line which outputs the scan signal;
    a control terminal of the eleventh transistor is connected with the constant low voltage level source, an input terminal of the eleventh transistor is connected with the pull-down module, and the output terminal of the eleventh transistor is connected with the control terminal of the sixth transistor;
    wherein the resetting module further comprises a second bootstrap capacitor, a terminal of the second bootstrap capacitor is connected with the constant high voltage level source, and another terminal of the second bootstrap capacitor is connected with the output terminal of the fourth transistor; and the scan driving circuit utilizes either P-type metal-oxide semiconductor transistors or N-type metal-oxide semiconductor transistors to control the pull-down controlling module, the pull-down module, the resetting module, the reset-controlling module, and the downward-transferring module; and
    wherein the pull-down controlling module is further used for receiving a scan signal of the next stage and generating the scan voltage signal having the low voltage level in the corresponding scan line, according to the scan signal of the next stage; and the reset-controlling module is further used for receiving a clock signal of the previous stage and generating the reset signal of the corresponding scan line, according to the clock signal of the previous stage.

2. The scan driving circuit as claimed in claim 1, wherein the pull-down controlling module comprises a first transistor and a second transistor;

a first scan signal is inputted into a control terminal of the first transistor, the scan signal of the previous stage is inputted into an input terminal of the first transistor, and an output terminal of the first transistor is connected with the pull-down module; and a second scan signal is inputted into a control terminal of the second transistor, the scan signal of the next stage is inputted into an input terminal of the second transistor, and an output terminal of the second transistor is connected with the pull-down module.

3. The scan driving circuit as claimed in claim 1, wherein the reset-controlling module comprises an eighth transistor and a ninth transistor;

a first scan signal is inputted into a control terminal of the eighth transistor, the clock signal of the next stage is inputted into an input terminal of the eighth transistor, and an output terminal of the eighth transistor is connected with the control terminal of the fourth transistor; and a second scan signal is inputted into a control terminal of the ninth transistor, the clock signal of the previous stage is inputted into an input terminal of the ninth transistor, and an output terminal of the ninth transistor is connected with the control terminal of the fourth transistor.

4. The scan driving circuit as claimed in claim 1, wherein the pull-down module comprises a third transistor, an input terminal of the third transistor is connected with the pull-down controlling module, a control terminal of the third transistor is connected with the pull-down controlling module, and an output terminal of the third transistor is connected with the output terminal of the fifth transistor.

5. The scan driving circuit as claimed in claim 1, wherein the downward-transferring module comprises a tenth transistor, a control terminal of the tenth transistor is respectively connected with the resetting module and the pull-down module, an input terminal of the tenth transistor is connected with the output terminal of the seventh transistor, and an output terminal of the tenth transistor outputs the clock signal of the present stage.

6. The scan driving circuit as claimed in claim 5, wherein the downward-transferring module further comprises a thirteenth transistor, a control terminal of the thirteenth transistor is connected with the control terminal of the tenth transistor, an input terminal of the thirteenth transistor is connected with the output terminal of the tenth transistor, and an output terminal of the thirteenth transistor outputs a cascaded signal of the present stage;

the resetting module further comprises a twelfth transistor, a cascaded signal of the previous stage is inputted into a control terminal of the twelfth transistor, an input terminal of the twelfth transistor is connected with the constant high voltage level source, and an output terminal of the twelfth transistor is connected with the control terminal of the fifth transistor; and the pull-down module comprises a third transistor, an input terminal of the third transistor is connected with the pull-down controlling module, the cascaded signal of the previous stage is inputted into a control terminal of the third transistor, and an output terminal of the third transistor is connected with the output terminal of the fifth transistor.

7. The scan driving circuit as claimed in claim 5, wherein the resetting module further comprises a twelfth transistor, a control terminal of the twelfth transistor is connected with the pull-down controlling module, an input terminal of the twelfth transistor is connected with the constant high voltage level source, and an output terminal of the twelfth transistor is connected with the control terminal of the fifth transistor.

8. A scan driving circuit for driving scan line in cascade, comprising:

a pull-down controlling module for receiving a scan signal of a previous stage and generating a scan voltage signal having a low voltage level in the corresponding scan line, according to the scan signal of the previous stage;

a pull-down module for pulling down a scan signal of the corresponding scan line, according to the scan voltage signal;

a reset-controlling module for receiving a clock signal of a next stage and generating a reset signal of the corresponding scan line, according to the clock signal of the next stage;

a resetting module for pulling up the scan signal of the corresponding scan line, according to the reset signal;

a downward-transferring module for generating and transmitting a clock signal of a present stage according to the scan signal of the scan line;

a first bootstrap capacitor for generating the scan voltage signal having either the low voltage level or a high voltage level in the scan line;

a constant low voltage level source for providing a low voltage level signal;

and a constant high voltage level source for providing a high voltage level signal, wherein the resetting module comprises a fourth transistor, a fifth transistor, a sixth transistor, a seventh transistor, and an eleventh transistor; the reset signal is inputted into a control terminal of the fourth transistor;

an input terminal of the fourth transistor is connected with the constant low voltage level source, and an output terminal of the fourth transistor is connected with an output terminal of the sixth transistor;

a control terminal of the fifth transistor is connected with the output terminal of the sixth transistor, an input terminal of the fifth transistor is connected with the constant high voltage down module;

a control terminal of the sixth transistor is connected with an output terminal of the eleventh transistor, and an input terminal of the sixth transistor is connected with the constant high voltage level source; a control terminal of the seventh transistor is connected with the output terminal of the sixth transistor, an input terminal of the seventh transistor is connected with the constant high voltage level source, and an output terminal of the seventh transistor is connected with an output terminal of the scan line which outputs the scan signal; and a control terminal of the eleventh transistor is connected with the constant low voltage level source, an input terminal of the eleventh transistor is connected with the pull-down module, and the output terminal of the eleventh transistor is connected with the control terminal of the sixth transistor; and wherein the pull-down controlling module is further used for receiving a scan signal of the next stage and generating the scan voltage signal having the low voltage level in the corresponding scan line, according to the scan signal of the next stage; and the reset-controlling module is further used for receiving a dock signal of the previous stage and generating the reset signal of the corresponding scan line according to the dock signal of the previous stage.

9. The scan driving circuit as claimed in claim 8, wherein the pull-down controlling module comprises a first transistor and a second transistor;

a first scan signal is inputted into a control terminal of the first transistor, the scan signal of the previous stage is inputted into an input terminal of the first transistor, and an output terminal of the first transistor is connected with the pull-down module; and a second scan signal is inputted into a control terminal of the second transistor, the scan signal of the next stage is inputted into an input terminal of the second transistor, and an output terminal of the second transistor is connected with the pull-down module.

10. The scan driving circuit as claimed in claim 8, wherein the reset-controlling module comprises an eighth transistor and a ninth transistor;

a first scan signal is inputted into a control terminal of the eighth transistor, the clock signal of the next stage is inputted into an input terminal of the eighth transistor, and an output terminal of the eighth transistor is connected with the control terminal of the fourth transistor; and a second scan signal is inputted into a control terminal of the ninth transistor, the clock signal of the previous stage is inputted into an input terminal of the ninth transistor, and an output terminal of the ninth transistor is connected with the control terminal of the fourth transistor.

11. The scan driving circuit as claimed in claim 8, wherein the pull-down module comprises a third transistor, an input terminal of the third transistor is connected with the pull-down controlling module, a control terminal of the third transistor is connected with the pull-down controlling module, and an output terminal of the third transistor is connected with the output terminal of the fifth transistor.

12. The scan driving circuit as claimed in claim 8, wherein the downward-transferring module comprises a tenth transistor, a control terminal of the tenth transistor is respectively connected with the resetting module and the pull-down module, an input terminal of the tenth transistor is connected with the output terminal of the seventh transistor, and an output terminal of the tenth transistor outputs the clock signal of the present stage.

13. The scan driving circuit as claimed in claim 12, wherein the downward-transferring module further comprises a thirteenth transistor, a control terminal of the thirteenth transistor is connected with the control terminal of the tenth transistor, an input terminal of the thirteenth transistor is connected with the output terminal of the tenth transistor, and an output terminal of the thirteenth transistor outputs a cascaded signal of the present stage;

the resetting module further comprises a twelfth transistor, a cascaded signal of the previous stage is inputted into a control terminal of the twelfth transistor, an input terminal of the twelfth transistor is connected with the constant high voltage level source, and an output terminal of the twelfth transistor is connected with the control terminal of the fifth transistor; and the pull-down module comprises a third transistor, an input terminal of the third transistor is connected with the pull-down controlling module, the cascaded signal of the previous stage is inputted into a control terminal of the third transistor, and an output terminal of the third transistor is connected with the output terminal of the fifth transistor.

14. The scan driving circuit as claimed in claim 8, wherein the resetting module further comprises a twelfth transistor, a control terminal of the twelfth transistor is connected with the pull-down controlling module, an input terminal of the twelfth transistor is connected with the constant high voltage level source, and an output terminal of the twelfth transistor is connected with the control terminal of the fifth transistor.

15. The scan driving circuit as claimed in claim 8, wherein the resetting module further comprises a second bootstrap capacitor; a terminal of the second bootstrap capacitor is connected with the constant high voltage level source, and another terminal of the second bootstrap capacitor is connected with the output terminal of the fourth transistor.

16. The scan driving circuit as claimed in claim 8, wherein the scan driving circuit utilizes either P-type metal-oxide semiconductor transistors or N-type metal-oxide semiconductor transistors to control the pull-down controlling module, the pull-down module, the resetting module, the reset-controlling module, and the downward-transferring module.

* * * * *